United States Patent
deKoninck et al.

(10) Patent No.: US 11,548,780 B2
(45) Date of Patent: *Jan. 10, 2023

(54) SYSTEMS AND METHODS FOR OPERATING A MEMS DEVICE BASED ON SENSED TEMPERATURE GRADIENTS

(71) Applicant: INVENSENSE, INC., San Jose, CA (US)

(72) Inventors: David deKoninck, Brossard (CA); Varun Subramaniam Kumar, San Jose, CA (US); Matthew Julian Thompson, Beaverton, OR (US); Vadim Tsinker, Belmont, CA (US); Logeeswaran Veerayah Jayaraman, Milpitas, CA (US); Sarah Nitzan, Palo Alto, CA (US); Houri Johari-Galle, San Jose, CA (US); Jongwoo Shin, Pleasanton, CA (US); Le Jin, Fremont, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/516,245

(22) Filed: Nov. 1, 2021

(65) Prior Publication Data

US 2022/0048760 A1 Feb. 17, 2022

Related U.S. Application Data

(63) Continuation of application No. 16/547,257, filed on Aug. 21, 2019, now Pat. No. 11,186,479.

(51) Int. Cl.
*G01L 19/04* (2006.01)
*G01K 1/20* (2006.01)
(Continued)

(52) U.S. Cl.
CPC .......... *B81B 7/0019* (2013.01); *B81B 7/0087* (2013.01); *G01K 1/20* (2013.01);
(Continued)

(58) Field of Classification Search
CPC ........ G01K 1/20; G01L 19/04; G01L 19/0092
See application file for complete search history.

(56) References Cited

U.S. PATENT DOCUMENTS

| 6,180,867 B1 | 1/2001 | Hedengren et al. |
| 6,959,583 B2 | 11/2005 | Platt |

(Continued)

FOREIGN PATENT DOCUMENTS

| CN | 101905853 A | 12/2010 |
| CN | 102348967 A | 2/2012 |

(Continued)

OTHER PUBLICATIONS

Office Action received for Chinese Patent Application No. 202080058875.0, dated Jul. 13, 2022, 12 pages (6 pages of English Translation and 6 pages of Original Document).

(Continued)

*Primary Examiner* — Herbert K Roberts
(74) *Attorney, Agent, or Firm* — Haley Guiliano LLP; Joshua Van Hoven; Stefan D. Osterbur

(57) ABSTRACT

An exemplary microelectromechanical device includes a MEMS layer, portions of which respond to an external force in order to measure the external force. A substrate layer is located below the MEMS layer and an anchor couples the substrate layer and MEMS layer to each other. A plurality of temperature sensors are located within the substrate layer to identify a temperature gradient being experienced by the MEMS device. Compensation is performed or operations of the MEMS device are modified based on temperature gradient.

21 Claims, 8 Drawing Sheets

(51) Int. Cl.
*B81B 7/00* (2006.01)
*G01L 9/00* (2006.01)

(52) U.S. Cl.
CPC ............ *G01L 9/0072* (2013.01); *G01L 19/04* (2013.01); *B81B 2201/0242* (2013.01)

(56) References Cited

U.S. PATENT DOCUMENTS

| | | |
|---|---|---|
| 8,358,296 B2 | 1/2013 | Anderson |
| 9,191,012 B2 | 11/2015 | Hsieh |
| 9,429,491 B2 | 8/2016 | Bemis |
| 9,523,619 B2 | 12/2016 | DeRosa |
| 10,024,880 B2 | 7/2018 | Stoops |
| 10,060,803 B2 | 8/2018 | Nakagawa |
| 11,073,531 B2 | 7/2021 | deKoninck et al. |
| 11,174,153 B2 | 11/2021 | Gurin et al. |
| 11,186,479 B2 | 11/2021 | deKoninck et al. |
| 2005/0152015 A1 | 7/2005 | Anderson |
| 2006/0245034 A1 | 11/2006 | Chen |
| 2009/0084177 A1 | 4/2009 | Ao |
| 2010/0078753 A1 | 4/2010 | Mehregany |
| 2013/0085699 A1 | 4/2013 | Berry |
| 2013/0186171 A1 | 7/2013 | Merrill |
| 2014/0169405 A1 | 6/2014 | Graham et al. |
| 2014/0208823 A1 | 7/2014 | Trusov |
| 2014/0250969 A1 | 9/2014 | Alagarsamy |
| 2016/0128193 A1 | 5/2016 | Duncan |
| 2017/0343443 A1 | 11/2017 | VanDeWeert |
| 2018/0038921 A1 | 2/2018 | Parsa |
| 2018/0164339 A1 | 6/2018 | Zwahlen et al. |
| 2018/0283956 A1 | 10/2018 | Van Buggenhout |
| 2019/0165759 A1 | 5/2019 | Nishizawa |
| 2020/0049539 A1 | 2/2020 | De Luca |
| 2021/0053819 A1 | 2/2021 | deKoninck |
| 2021/0053820 A1 | 2/2021 | Gurin |
| 2021/0055321 A1 | 2/2021 | deKoninck |

FOREIGN PATENT DOCUMENTS

| | | |
|---|---|---|
| CN | 104866134 A | 8/2015 |
| CN | 106257250 A | 12/2016 |
| CN | 107003161 A | 8/2017 |
| CN | 107416757 A | 12/2017 |
| CN | 108369245 A | 8/2018 |
| CN | 109842396 A | 6/2019 |
| CN | 110036286 A | 7/2019 |
| CN | 114269681 A | 4/2022 |
| CN | 114270154 A | 4/2022 |
| JP | 2017-131541 A | 8/2017 |
| WO | 2021/034454 A1 | 2/2021 |

OTHER PUBLICATIONS

International Preliminary Report on Patentability received for PCT Patent Application No. PCT/US2020/043573, dated Mar. 3, 2022, 8 pages.

International Preliminary Report on Patentability received for PCT Patent Application No. PCT/US2020/043582, dated Mar. 3, 2022, 8 pages.

International Search Report and Written Opinion received for PCT Patent Application No. PCT/US2020/043582, dated Nov. 9, 2020, 9 pages.

International Search Report and Opinion for PCT/US2020/043573 dated Nov. 2, 2020 (13 pages).

Office Action received for Chinese Patent Application No. 202080058858.7, dated Jul. 4, 2022, 19 pages (9 pages of English Translation and 10 pages of Original Document).

SYSTEMS AND METHODS FOR OPERATING A MEMS DEVICE BASED ON SENSED TEMPERATURE GRADIENTS

CROSS-REFERENCE TO RELATED APPLICATION

This application is a continuation of U.S. patent application Ser. No. 16/547,257 (now allowed), filed on Aug. 21, 2019. The disclosure of such application is hereby incorporated by reference herein in its entirety.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) devices or sensors such as accelerometers and gyroscopes capture complex movements and determine orientation or direction. For example, smartphones are equipped with accelerometers and gyroscopes to augment navigation systems that rely on Global Position System (GPS) information. In another example, an aircraft determines orientation based on gyroscope measurements (e.g., roll, pitch, and yaw) and vehicles implement assisted driving to improve safety (e.g., to recognize skid or roll-over conditions).

Each of the end-use products of MEMS devices involves placement adjacent to other electronic components, such as displays, processors, memory, antennas, and touchscreens. With the proliferation of MEMS devices in scores of different device types by different manufactures, heat dispersion from adjacent components can be unpredictable as to the amount of heat dispersed from other components, the duration and pattern of the heat dispersion, and the locations where heat is dispersed to the MEMS device. Furthermore, these numerous different types of devices are used in scores of end-use applications ranging from simple consumer electronics to industrial environments and vehicles, further exacerbating the numerous heat dispersion profiles that MEMS devices may endure during operation.

SUMMARY

In an embodiment of the present disclosure, a microelectromechanical (MEMS) device may comprise a first layer comprising a first plane located within the first layer, a second layer comprising a second plane located within the second layer, wherein the second layer is located below the first layer, and an anchor, wherein the anchor couples the first layer to the second layer. The MEMS device may comprise a plurality of temperature sensors located within the second plane, wherein each temperature sensor of the plurality of temperature sensors is located at a different distance relative to the anchor. The MEMS device may comprise processing circuitry configured to output a signal that corresponds to a thermal gradient perpendicular to the second plane based on an output of the plurality of temperature sensors.

In an embodiment of the present disclosure, a microelectromechanical (MEMS) device may comprise a first layer comprising a first plane located within the first layer, wherein the first layer comprises at least one proof mass, a second layer comprising a second plane located within the second layer, wherein the second layer is located below the first layer, and wherein the first layer and the second layer are separated by a gap, and an anchor, wherein the anchor couples the first layer to the second layer and is at least partially located within the gap. The MEMS device may further comprise a plurality of temperature sensors located within the second plane, wherein a first temperature sensor of the plurality of temperature sensors is located below the anchor, and wherein a second temperature sensor of the plurality of temperature sensors is not located below the anchor.

In an embodiment of the present disclosure, a method of operating a microelectromechanical (MEMS) device may comprise receiving, from a first temperature sensor located in a first layer proximate to an anchor, a first temperature signal, wherein the anchor is coupled between the first layer and a second layer within a gap between the first layer and the second layer. The method may further comprise receiving, from a second temperature sensor located in the first layer at a distance further from the anchor than the first temperature sensor, a second temperature signal. The method may further comprise determining, by processing circuitry, a thermal gradient in the direction of the second layer based on the first temperature signal and the second temperature signal.

BRIEF DESCRIPTION OF THE DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

Figure 1:
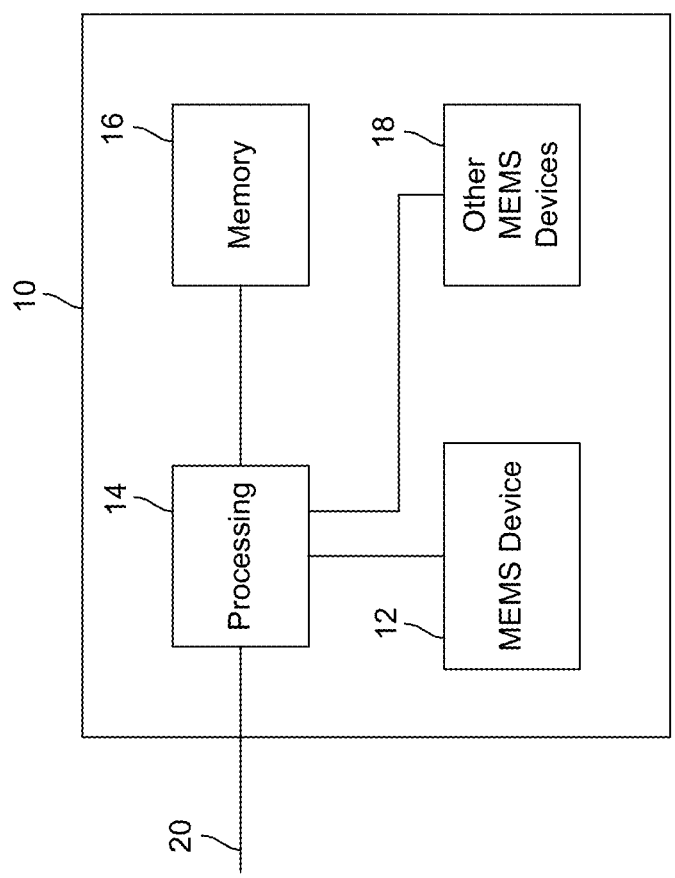
FIG. 1 shows an exemplary motion sensing system in accordance with some embodiments of the present disclosure.

An exemplary MEMS device may have a plurality of layers that are fabricated, patterned, and bonded together. A MEMS layer may be bonded between other layers (e.g., an upper or cap layer and a lower substrate layer) and may include one or more components that may move in response to particular stimuli that are applied to the MEMS device. Electrical circuitry of the MEMS device may interact with the micromechanical components to output signals of interest. For example, MEMS inertial sensors may include a suspended spring-mass system that is designed such that portions of the suspended spring-mass system (e.g., proof masses suspended within the suspended spring-mass system) move in a particular manner in response to particular applied forces, such as linear acceleration along a measurement axis or angular velocity about a measurement axis. An exemplary pressure sensor may have a cavity that is hermetically sealed with respect to one portion of the MEMS layer and another cavity that receives a gas at another portion of the MEMS layer, resulting in movement of the MEMS layer based on the relative pressures and MEMS layer design. Other exemplary devices that can be fabricated using MEMS techniques include magnetometers and ultrasonic sensors, although there are wide variety of devices such as sensors and actuators that can be fabricated using MEMS techniques.

Because MEMS devices may be extremely small they are used in numerous electronic devices, often in proximity to components that are significant heat sources, or in end-use applications where the environment includes significant heat sources. As a result, MEMS devices may be subject to a variety of heat conditions, resulting in significant variances in relative location of exposure, time of exposure, rate of change over time, etc. As a result, MEMS devices may not be at a uniform temperature and may instead experience complex thermal gradients throughout the device as a whole. These thermal gradients may also be impacted by the design of the MEMS device itself, including the materials of the respective layers, bonding materials between layers, configuration of bonding locations in which heat may transfer between layers, intra-layer design such as MEMS layer design and locations and density of electrical components (e.g., within a CMOS substrate layer).

The thermal gradients may cause complex changes to the operation of the sensor, for example, by causing components within the MEMS layer to expand or contract, modifying clearances between movable components, changing operating parameters of electrical components, and creating pressure differentials within the cavity of the MEMS device. Because the thermal gradient may not be at a steady state, these effects may be experienced differently by similar electrical and mechanical components at different relative locations within the sensor. Changing thermal gradients may result in Knudsen forces at boundaries where particles are transferring energy therebetween, resulting in forces imparted on mechanical components such as proof masses. All of these changes due to thermal gradients may impact MEMS devices and components in complex ways, and may degrade the precision and accuracy of the MEMS device.

One or more of the layers of the MEMS device (e.g., a CMOS substrate layer) may include electrical circuitry that can be located and connected in a manner to measure and estimate thermal gradients, including complex thermal gradients transferred from other layers. The electrical circuitry can include components that are known to respond in a predetermined manner to temperature and/or changes in temperature, such as thermistors, Bipolar Junctions Transistors (BJTs)=, and Metal-oxide-semiconductor field-effect transistors (MOSFETs). Based on the sensor design, these temperature-sensitive components (temperature sensors) can be located and configured to detect and/or estimate particular temperature gradients, both within the layer that they are located in and from other layers.

Heat from an external source is applied to the MEMS device at particular locations along the periphery of the MEMS device, such as the top (e.g., along top of the cap layer), sides (e.g., for a four-sided sensor, any of four sides of the cap layer, MEMS layer, or CMOS layer, depending on the location of the heat source), or bottom (e.g., along the bottom of the CMOS layer). These may be locations where heat is likely transferred due to exposure to the external environment, circuit boards, or other electronic components. By placing temperature sensors at different locations relative to these edges within a particular layer (e.g., an electrical component layer such as a CMOS layer), and in some embodiments within different component planes, the locations of heat sources as well as patterns of heat dispersion may be identified.

In an x-y-z coordinate system a MEMS layer may be bonded to and located above the substrate layer in the positive z-direction while the cap layer may be bonded to and located above the MEMS layer in the positive z-direction. Connection points between these layers such as anchors that interconnect the MEMS layer and the substrate layer may be used to estimate thermal gradients outside of the substrate layer, as these locations may exhibit relative changes in temperature within the substrate layer due to temperature dispersion from/to the MEMS layer via the anchors. For example, temperature sensors located remote from the anchors within the substrate layer should have lower temperatures, assuming no in-plane thermal gradients are impacting the temperature.

Once thermal ingredients are identified, the information about the thermal gradients may be utilized to improve the operation of the MEMS device. In some embodiments, adjustments may be made to measured values, such as by changing scaling values, compensation codes, additive compensation values, offsets, A/D conversion thresholds, amplifier inputs, and the like. Changes may also be made to the operation of the MEMS device, such as amplitude, phase or frequency of applied signals to MEMS layer or electrical components of the MEMS device. Identification of thermal gradients may also be used to impact the operation of other devices, such as by sending alarms or warnings that may be used to adjust the operation of other electrical components that are adjacent to the MEMS device, or to provide warnings to another system such as that measurements may have lower accuracy or to allow the device to cool. Because of the ability of the temperature sensing system described herein to identify and pinpoint complex thermal gradients, the compensation or change in operation may be tailored to the specific type and intensity of the thermal gradient.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS device 12 and supporting circuitry, such as processing circuitry 14 and memory 16. In some embodiments, one or more additional MEMS devices 18 (e.g., MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS device 12 or other MEMS device 18, or on an adjacent portion of a chip to the MEMS gyroscope 12 or other MEMS device 18) to control the operation of the MEMS device 12 or other MEMS devices 18 and perform aspects of processing for the MEMS device 12 or other MEMS devices 18. In some embodiments, the MEMS device 12 and other MEMS devices 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS device 12 by interacting with the hardware control logic, and process signals received from MEMS device 12. The microprocessor may interact with other sensors in a similar manner.

Although in some embodiments (not depicted in FIG. 1), the MEMS device 12 or other MEMS devices 18 may communicate directly with external circuitry (e.g., via a serial bus or direct connection to sensor outputs and control inputs), in an embodiment the processing circuitry 14 may process data received from the MEMS device 12 and other MEMS devices 18 and communicate with external components via a communication interface 20 (e.g., a SPI or I2C bus, or in automotive applications, a controller area network (CAN) or Local Interconnect Network (LIN) bus). The processing circuitry 14 may convert signals received from the MEMS device 12 and other MEMS devices 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS devices, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS device 12 may include one or more movable proof masses that are configured in a manner that permits the MEMS device to measure a desired force (e.g., linear acceleration, angular velocity, magnetic field, etc.) along an axis. In some embodiments, the one or more movable proof masses may be suspended from anchoring points, which may refer to any portion of the MEMS device which is fixed, such as an anchor that extends between a layer (e.g., a substrate or CMOS layer) that is parallel to the MEMS layer of the device, a frame of the MEMS layer of the device, or any other suitable portion of the MEMS device that is fixed relative to the movable proof masses. The proof masses may be arranged in a manner such that they move in response to measured force. The movement of the proof masses relative to a fixed surface (e.g., a fixed sense electrode extending into the MEMS layer or located parallel to the movable mass on the substrate) in response to the measured force is measured and scaled to determine the desired inertial parameter.

Heat sources from adjacent components (e.g., processors, power sources, transponders, etc.) or from the external environment may cause heat dispersion to a portion of the MEMS sensor. When this dispersion of heat generates a thermal gradient along any of the x-axis, y-axis, or z-axis, or combinations thereof, air pressure within the cavity may become unbalanced, based on the different relative temperatures at different portions of the cavity. This may cause the proof masses to move a fixed distance (e.g., corresponding to the pressure differential) relative to the electrodes, resulting in an offset in the sensed capacitance. This offset is unrelated to the measured parameter and may reduce the accuracy of measurements.

Figure 2A:
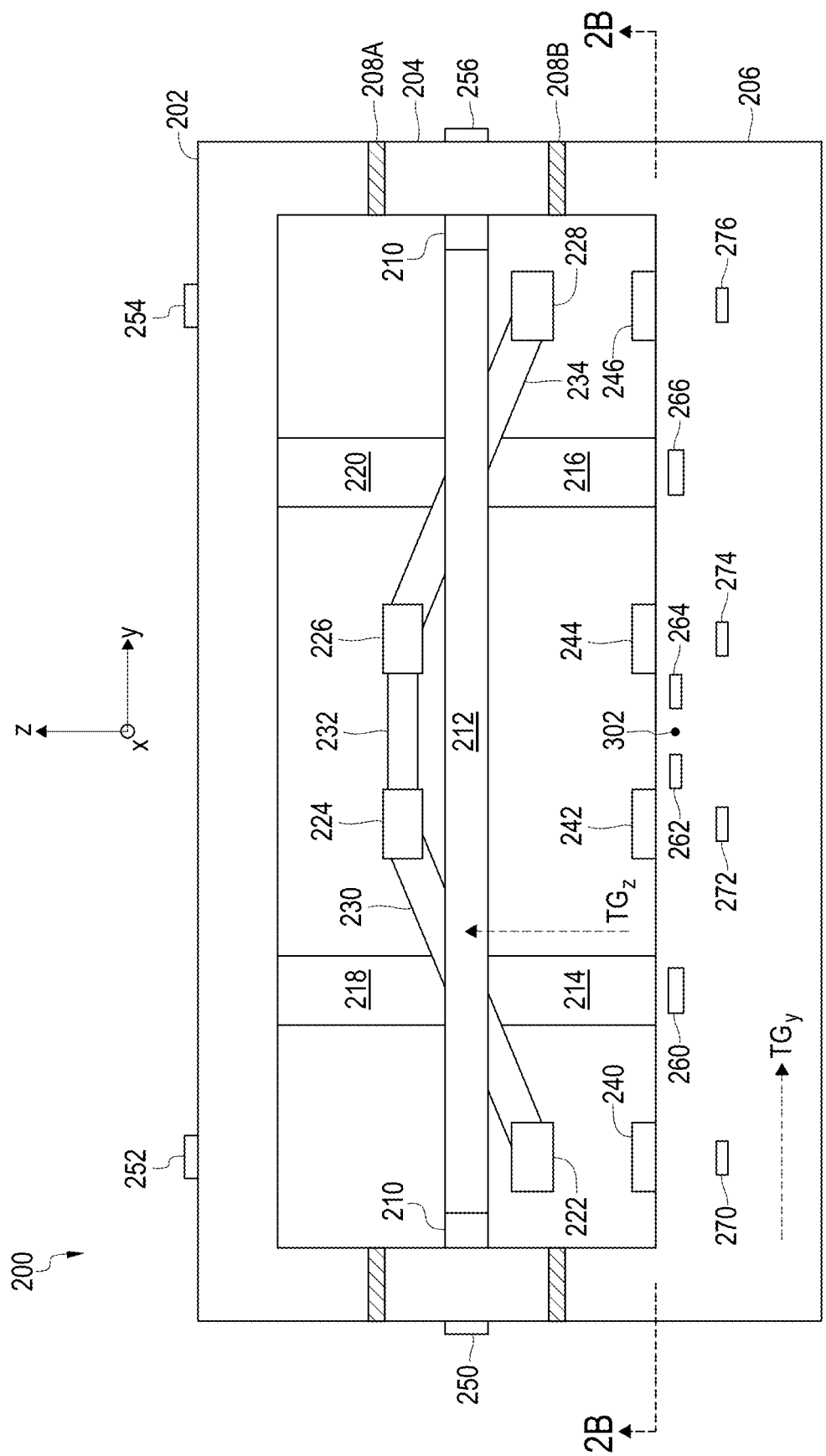
FIG. 2A shows a side view of an exemplary MEMS device in accordance with some embodiments of the present disclosure.

FIG. 2A shows a side view of an exemplary MEMS gyroscope in accordance with some embodiments of the present disclosure. Although the present disclosure will discuss thermal gradient sensing and compensation in the context of a gyroscope and a particular gyroscope design (e.g., an out-of-plane sensing gyroscope with a plurality of centrally located and evenly spaced anchors), it will be understood that the temperature sensors, configurations, and compensation described herein may be applied to a variety of suitable MEMS or other semiconductor devices where thermal gradient is desired to be measured. As described herein, temperature sensors may be located in relative locations with respect to key heat dispersion points (e.g., anchors, bond points, vias, exposed sidewalls, etc.) in order to accurately identify different thermal gradients of interest. Based on the principles described herein, it will be understood that the temperature gradient sensing and compensation techniques described herein may be applied to numerous device types and designs. In some embodiments, the MEMS device 200 can be an accelerometer, magnetometer, barometer, microphone or an ultrasonic sensor.

The MEMS device 200 of FIG. 2A may include a cap layer 202, MEMS layer 204, and substrate layer 206, although in some embodiments additional layers may be added or one or more layers may be substituted or removed. In an exemplary embodiment, the layers may be bonded together by bonding layers 208A and 208B, with cap layer 202 bonded to MEMS layer 204 by bonding layer 208A and MEMS layer 204 bonded to substrate layer 206 by bonding layer 208B. Heat dispersion within and between these layers may depend at least in part based on the respective materials of the cap layer 202.

The respective layers of the MEMS device 200 may be fabricated, patterned, bonded, and processed to generate a particular device of interest such as the MEMS gyroscope of FIG. 2A. In the exemplary embodiment of FIG. 2A, a hermetically sealed cavity is formed and a MEMS gyroscope is located within the cavity. A gas is sealed within the cavity at a nominal pressure. The gas located within the cavity has its own thermal properties depending on the gas, its nominal pressure, and the shape of components within the cavity. For example, depending upon the pattern of the thermal gradient experienced by the MEMS device and the shape of the MEMS components of the gyroscope of FIG. 2A, certain thermal gradients such as a negative z-axis gradient TGz may result in temperature differentials for the gas at different locations in the cavity (e.g., based on proximity to heat sources and/or the intervening MEMS layer at least partially inhibiting heat dispersion between portions of the cavity). This may result in internal pressure differentials and Knudsen forces on the MEMS layer, which may in some instances result in a fixed movement of movable MEMS components such as proof masses relative to the normal location of the proof masses.

The MEMS layer 204 may include a suspended spring-mass system 212, which in the exemplary embodiment of FIG. 2A, comprises a MEMS gyroscope. In the exemplary embodiment of FIG. 2A, springs 210 couple the suspended spring-mass system 212 to the bonded MEMS layer 204. The suspended spring-mass system 212 includes a plurality of components that respond in a desired manner in response to a force to be sensed, such as by allowing proof masses 222, 224, 226, and 228 to move out-of-plane along the z-axis in response to an angular velocity about an in-plane axis. In the exemplary embodiment of FIG. 2A, a number of connecting arms and/or springs 230, 232, and 234 couple the motion of the proof masses to each other, such that respective masses 222/224 and 226/228 move in anti-phase in a similar manner.

Movement of the of the proof masses 222/224/226/228 may be sensed in a variety of suitable manners such as piezoelectric or capacitive sensing, although the exemplary embodiment of FIG. 2A depicts electrodes 240/242/244/246 patterned on the substrate, each forming a respective capacitor with a respective one of the proof masses having a capacitance that changes based on the distance between the electrode and proof mass (e.g., a capacitor of proof mass 222 and electrode 240, a capacitor of proof mass 224 and electrode 242, a capacitor of proof mass 226 and electrode 244, and a capacitor of proof mass 228 and electrode 246). Thermal gradients may cause changes to the distance between the proof masses and the electrodes as described herein, which may result in additive and/or periodic changes to the sensed capacitance and thus the measured value (e.g., angular velocity).

As described herein, heat sources may apply a thermal gradient to some portion of the MEMS device 200, for example, via contact or proximity to any of the sides of the MEMS device 200. The pattern of heat dispersion within the MEMS device 200 depends on the nature of the heat source (e.g., point or distributed), the location where the heat source is applied, the material properties of the various portions of the MEMS device, the design of the cavity and device components, and other factors as described herein. For simplicity of demonstration, the present discussion will refer to thermal gradients having components along the out-of-plane z-axis (i.e., TGz) and within the x-y plane (i.e., TGx and TGy). However, it will be recognized that in some instances there may be multiple significant heat sources applied at different portions of the MEMS device, such that multiple thermal gradients disperse throughout the MEMS device in different patterns and interact at locations within the MEMS device (e.g., at least until a steady state temperature is reached after a lengthy period of exposure to the multiple significant heat sources).

In an exemplary embodiment as depicted in FIG. 2A, the cap layer 202, MEMS layer 204, and substrate layer 206 are not only bonded to each other at the exterior of the MEMS device 200, but are also coupled via anchors 214, 216, 218, and 220. Anchors 218 and 220 couple cap layer 202 to MEMS layer 204 and anchors 214 and 216 couple MEMS layer 204 to substrate layer 206. These anchors provide heat dispersion paths through which thermal gradients propagate between the respective layers at a greater rate than via the gas of the cavity. The anchors thus provide for heat dispersion between the respective layers in the out-of-plane (z-axis) direction, and are representative of the z-axis thermal gradient TGz (e.g., with the magnitude of thermal gradients based on the anchor locations, size, and material).

In some embodiments of the present disclosure, temperature sensors may be located on or within one or more of the layers of the MEMS device. For example, many electronic components such as resistors, thermistors, BJTs, MOSFETs, and thermocouples may have known responses to temperature that can be monitored. In an exemplary embodiment, some of these temperature sensors may be located within a layer of the MEMS device that allows for the creation and monitoring of temperature sensors, such as a CMOS substrate layer 206.

Although it will be understood that any suitable layer having appropriate materials and processes to form electronic components (e.g., the patterning of thermistors, thermocouples, or other components within semiconductor layers), in the exemplary embodiment of FIG. 2A the CMOS substrate layer 206 includes multiple planes (i.e., x-y planes) on which electronic components may be formed. For example, temperature sensors 260, 262, 264, and 266 may be located in a first x-y plane relatively closer to the upper plane of the CMOS substrate layer 206. Temperature sensors 270, 272, 274, and 276 may be located in a second x-y plane that is further away from the upper plane of the CMOS substrate layer 206. Although particular depths are depicted in FIG. 2A, it will be understood that a number of different temperature sensor depths (e.g., planes for temperature sensors) may be utilized in embodiments of the present disclosure.

The temperature sensors may be located at respective locations to capture particular information of interest, such as temperature proximate to the anchors 214 and 216 (e.g., temperature sensors 260 and 266), temperature proximate to electrodes (e.g., temperature sensor 270 for electrode 240, temperature sensors 262 and 272 for electrode 242, temperature sensors 264 and 274 for electrode 244, and temperature sensor 276 for electrode 246), temperature proximate to the edges of the MEMS device 200 (e.g., temperature sensors 270 and 276), and temperatures located near the interior of the MEMS device (e.g., temperature sensors 262, 264, 272, and 274).

Temperature sensors may also be located at locations on the surface of layers at the interior or exterior of the MEMS device 200. Although a variety of temperature sensors may be located at a variety of locations on the surface of layers, in an exemplary embodiment thermistors and/or thermocouples may be patterned on the surface of layers of the MEMS device, to form temperature sensor 250 and 256 located on an exterior surface of the MEMS layer 204 and temperature sensors 252 and 254 located on a top surface of cap layer 202.

Figure 2B:
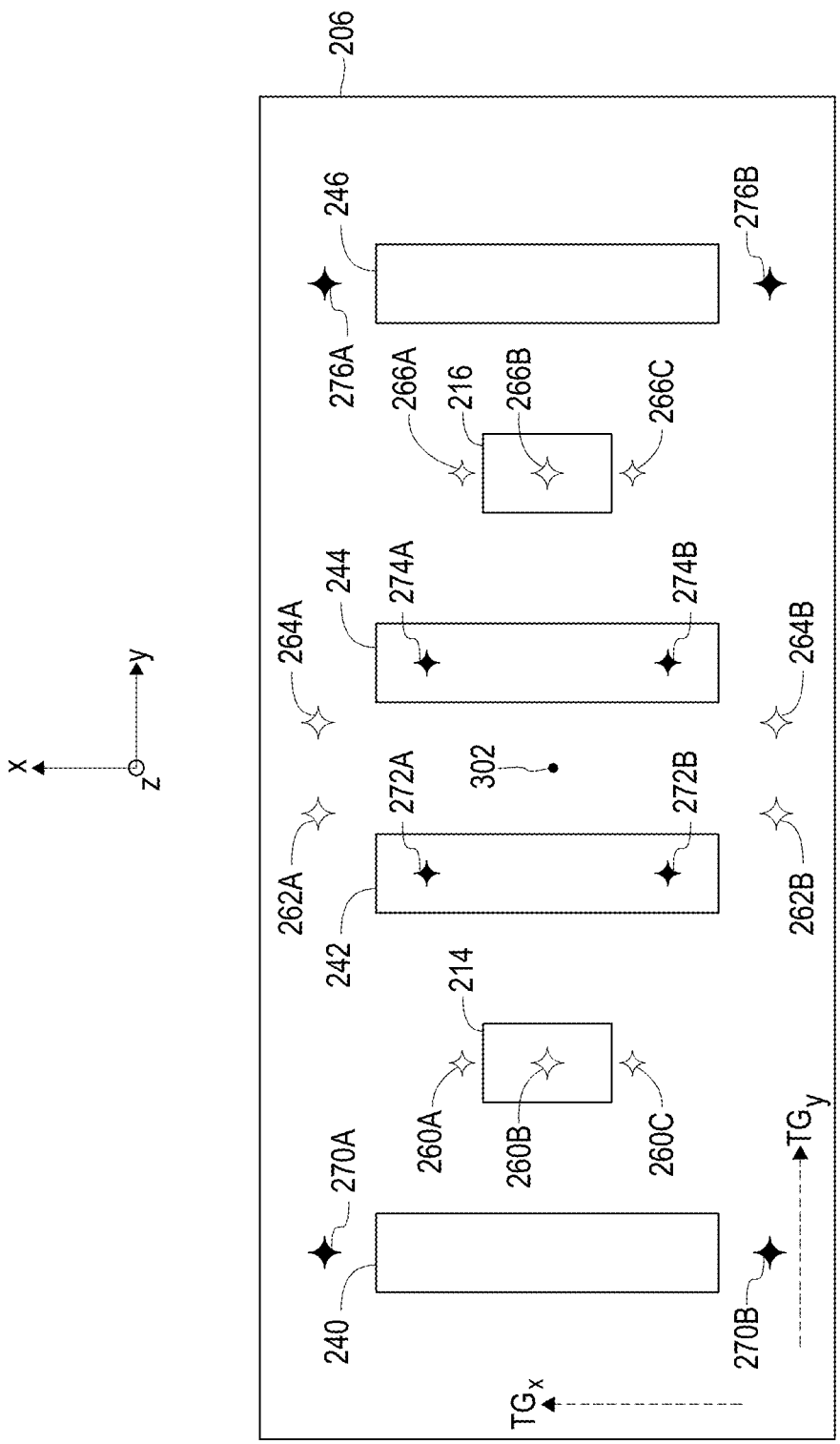
FIG. 2B shows a top view of a substrate layer of the MEMS device of FIG. 2A in accordance with some embodiments of the present disclosure.

FIG. 2B shows a top view of a substrate layer of the MEMS gyroscope of FIG. 2A in accordance with some embodiments of the present disclosure. In the exemplary embodiment of FIG. 2B, the locations of the temperature sensors are depicted in a particular configuration in respective x-y planes within the substrate, with the temperature sensors 260A, 260B, 260C, 262A, 262B, 264A, 264B, 266A, 266B and 266C located within a first x-y plane at a first depth below the depicted upper surface of the substrate. The temperature sensors 270A, 270B, 272A, 272B, 274A, 274B, 276A, and 276B are located within a second x-y plane at a second depth below the depicted upper surface of the substrate, with the second plane being located at a greater z-direction depth than the first plane. Although particular sensor locations and a particular number of sensors are depicted in FIGS. 2A and 2B, it will be understood that the sensor locations and quantity of sensors may be varied in accordance with the present disclosure based on factors such as MEMS device design, likely locations of heat sources, anchor locations, and the like. And although the temperature sensors of FIGS. 2A and 2B are depicted in two x-y planes at respective z-axis depths within the substrate layer 206, the temperature sensors may be located on a single plane or on more than two planes, or on planes that are not normal to the z-axis of the MEMS device.

The top view of FIG. 2B depicts the locations where the anchors 214 and 216 contact and attach to the substrate layer 206, creating a path for thermal gradients to pass between MEMS layer 204 and substrate layer 206. Electrodes 240, 242, 244, and 246 are depicted in FIG. 2B as overlying the substrate layer 206. In the exemplary embodiment of FIGS. 2A and 2B, the temperature sensors are located at relative locations with respect to the primary heat sources, such as the edges of the substrate layer 206 and the anchor locations 214 and 216. In some embodiments, the design and materials for the electrodes 240, 242, 244, and 246 may be such that the electrodes may also function as heat sources for the substrate layer 206 under certain conditions.

In the exemplary embodiment of FIGS. 2A and 2B, the temperature sensors are located in a manner such that a variety of temperature data may be obtained, although it will be understood that different numbers of temperature sensors may be placed at different locations, based on sensor design (e.g., anchor and electrode locations, and likely locations of heat sources based on end uses and/or insulating packaging located proximate to one or more of the sides of the MEMS device) and other factors (e.g., types of temperature sensors available and locations suitable for placement of temperature sensors). In the exemplary embodiment of FIGS. 2A and 2B, temperature sensors may be located at different locations with respect to the edges of the sensor along the x and y axes. A heat source applied along the y-axis at the edge closest to electrode 240 and a cold source along the y-axis on the opposite side will result in a thermal gradient TGy and differential (i.e., decreasing) temperature outputs depending on temperature sensor location relative to the thermal gradient and heat source (i.e., zero relative temperature at 302 with the temperature sensed by temperature sensors 270A/270B and 276A/276B being equal and opposite in magnitude, temperature sensors 260A/260B/260C and 266A/266B/266C being equal and opposite in magnitude, and temperature sensors 272A/272B and 274A/274B being equal and opposite in magnitude.) Swapping the locations of the heat source and cold source along the y-axis (e.g., such that the heat source closest to electrode 246) will result in similar temperature sensor outputs with zero relative temperature change at 302.

A heat source applied along the x-axis at the edge closest to temperature sensors 270B, 262B, 264B, and 276B along with a cold source applied at the opposite side will result in a thermal gradient TGx and differential (i.e., zero relative temperature at 302 and 260B/266B temperature outputs depending on the location of temperature sensors relative to the thermal gradient and heat source (i.e., such that the outputs of the temperature sensors 262B/264B and 262A/264A being equal and opposite in magnitude, temperature sensors 270B/276B and 270A/276A being equal and opposite in magnitude, temperature sensors 272B/274B and 272A/274A being equal and opposite in magnitude, temperature sensors 260C/266C and 260A/266A being equal and opposite in magnitude). Swapping the heat source and cold source along the x-axis (e.g., such that the heat source is closest to temperature sensor 270A, 262A, 264A, and 276A) will result in similar temperature sensor outputs with zero relative temperature at 260B/266B and 302.

A heat source applied along the z-axis originating from one of the layers above substrate layer 206 and a cold source on the opposite side of substrate layer 206 will result in a thermal gradient TGz (depicted in FIG. 2A) and differential (i.e., decreasing) temperature outputs depending on their location relative to the thermal gradient and heat source. In an exemplary embodiment where temperature sensors are located on other layers (e.g., temperature sensors 252/254 on cap layer 202 and temperature sensors 250 and 256 on MEMS layer 204), these temperature sensors may experience a relatively large change in output compared to some or all of the temperature sensors in the substrate layer 206 (e.g., with the possible exception of temperature sensors 260A/260B/260C/266A/266B/266C located proximate to the anchors 214 and 216). The outputs of temperature sensors 250, 252, 254, and 256 will also vary with respect to the exact location of the heat source with respect to the cap layer 202 or MEMS layer 204.

In some embodiments of the present disclosure temperature sensors 260A/260B/260C and 266A/266B/266C may be located within a plane of the substrate layer 206 below each of the anchoring regions 214 and 216 and temperature sensors may be located within the plane of the CMOS layer remote from the anchoring regions. The temperature differences measured between the locations may correspond to the dispersion of heat from the anchoring regions which in turn corresponds to thermal gradient between the MEMS layer to the substrate layer. Different degrees of thermal gradient may in turn correspond to a different degree of offset in the location in the proof mass due to thermal gradient. In order to capture the z-axis thermal gradient that is relevant to z-axis proof mass offset, in some embodiments the temperature may be located and configured such that other thermal gradients (e.g., in-plane within the CMOS layer) are rejected. Based on a correspondence between the z-axis thermal gradient and the offset, compensation may be applied to more accurately capture the actual z-axis linear acceleration in the presence of a z-axis thermal gradient.

Within the substrate layer 206, the response of the temperature sensors due to the z-axis temperature gradient TGz transferred through the anchors will be greatest at temperature sensor 260B and 266B directly below the anchors and decrease in temperature as the thermal gradient dissipates outward. Temperature sensors 260A/260C/266A/266C may be slightly offset from anchors 214 and 216 and output values indicative of the dispersion of heat from the anchors to through the material of the substrate layer 206. The heat dispersion to the other temperature sensors will be reduced the further away that the temperature sensor is from the anchors 214 and 216, with sensors located between the anchors 214 and 216 (e.g., temperature sensors 272A/272B, 262A/262B, 264A/264B, and 274A/274B) experiencing substantial changes in temperature due to heat dispersion from both anchors. Although the thermal gradient from electrodes 240/242/244/246 is likely to be substantially less than the thermal gradient from anchors 214/216, heat may dissipate from the electrodes in a similar manner. Z-axis temperature gradients may also be transferred to the substrate layer 206 via outer walls of the MEMS device (e.g., directly from MEMS layer 204 to substrate layer 206 via bonding 208B), in which case z-axis thermal gradients may be experienced by the temperature sensors within the substrate layer in a similar manner to x-axis and or y-axis thermal gradients (e.g., as a heat source applied from the side of the substrate layer 206).

The temperature sensors within the substrate layer may also have different outputs based on the z-axis location of the temperature sensors within the substrate layer 206 (e.g., outputs from temperature sensors 270A/270B, 272A/272B, 274A/274B, and 276A/276B may also be reduced based on dispersion in heat along the z-axis). The outputs of the temperature sensors may be substantially different in the presence of a z-axis thermal gradient in the positive z-direction (e.g., from a heat source applied below the substrate layer 206). In contrast to a thermal gradient applied via the MEMS layer 204, the temperature sensors within the substrate layer 206 should have substantially similar values, with temperature sensors located closer to the bottom of the substrate layer 206 (e.g., temperature sensors 270A/270B, 272A/272B, 274A/274B, and 276A/276B) experiencing larger relative changes in output compared to temperature sensors located closer to the top of the substrate layer 206 (e.g., temperature sensors 260A/260B/260C, 262A/262B, 264A/264B, and 266A/266B/266C). Such a temperature gradient may also be identifiable because there should not be a significant difference in temperature sensed proximate to the anchors as compared to other sensors within the same x-y plane of the substrate layer.

The outputs of the temperature sensors may be provided to processing circuitry for additional processing. The temperature sensor outputs may be provided to the processing circuitry by any suitable form of transmission, such as by wirebonds, vias, or other suitable electrical transmission paths. In some embodiments, some or all of the processing circuitry utilized to initially process the temperature sensor outputs may be included within the MEMS device 200, while in some embodiments some or all of the processing may be performed by external circuitry such as a microprocessor that receives data via a wired or wireless data path. In the exemplary embodiment of FIGS. 2A and 2B, the processing circuitry may be included in the CMOS substrate layer 206, with temperature sensor outputs from temperature sensors within the CMOS substrate layer 206 processed via internal electrical connections (not depicted) and other temperature sensors outputs (e.g., of temperature sensors 250, 252, 254, and 256) provided to the processing circuitry via wire bonds to the CMOS substrate layer 206 (not depicted).

The temperature sensor outputs may be analyzed by the processing circuitry to identify thermal gradients of interest. As described herein, the absolute values of temperature sensor outputs and rate of change of temperature sensor outputs may provide detailed information about the location of the heat source (e.g., applied at which layer of the MEMS device, applied at which side of the MEMS device, and extent of overlap between the heat source and the MEMS device), the intensity of the heat source (e.g., based on relative temperature sensor outputs, rate of change of outputs proximate the heat source, etc.), and pattern of application (e.g., heat sources applied in a periodic manner, as pulses, or in other patterns, versus heat sources that have minimal variation). In some embodiments, respective temperature sensor outputs (e.g., along axes within an x-y plane to identify lateral thermal gradients, at different depths/planes to identify vertical and/or lateral thermal gradients, or at relative locations with respect to a center point and anchor as described with respect to FIGS. 3A-3C for rejecting lateral thermal gradients while measuring vertical thermal gradients) may be coupled to circuitry such as resistive bridges (e.g., with temperature sensors as one or more of the resistances) such that relative differences in temperature sensor outputs may be quickly determined by a single output value. In some embodiments, different subsets of temperature sensors may be of different types, for example, having different accuracy or response time.

In some embodiments, one or more switching elements (e.g., switches, transistors, MOSFETS, etc.) may selectively change the temperature sensors being monitored and/or selectively combine temperature sensor outputs (e.g., as provided to bridges as described herein) to measure particular temperature characteristics. For example, in some embodiments a subset of the temperature sensors may be switched such that they are located in a particular manner as described herein to reject lateral thermal gradients and/or induced strain on the sensor (e.g., to identify perpendicular thermal gradients). Other temperature sensors may be switched such that they measure lateral thermal gradient, intentionally identify strain effects, measure absolute temperature, or suitable combinations thereof.

A thermal gradient may alter the offset and sensitivity of the MEMS device. Operation of the MEMS device depends on movement of the physical components and measurement of the accelerometer is taken in reference to a reference state. Thermal gradients may create Knudsen forces and non-homogenous changes in air pressure, e.g., based on different temperatures and pressures within the cavity. The creation of Knudsen forces may cause suspended components of the device (e.g., proof masses 222/224/226/228) to move absent any applied external force (e.g., the proof masses move to a new reference state when the MEMS device is supposed to be in a reference state and stationary). The changes in air pressure may cause a similar movement to the suspended proof masses because forces result from the air pressure that are applied to the proof masses. Movement of the proof masses during reference state is undesired because it adds a component to the measured value output that is not due to force being measured. When the reference state capacitance between a portion of a proof mass and an electrode is a known value, the unknown measured value is determined using this known value and a change in capacitance from the known value. On the other hand, when Knudsen forces or other changes to the location of the proof masses relative to the electrodes due to thermal gradients skew the reference state capacitance value, the accuracy of the determination of measured force is affected.

In some embodiments, the processing circuitry may also receive additional external data relating to heat sources. For example, the processing circuitry may be in communication with other circuitry such as external processors, batteries, displays, transponders, or other temperature measurement circuitry of the end-use device in which the MEMS device is incorporate. Information about the operation of these components may be provided to the processing circuitry. In some embodiments, such information may be correlated with temperature sensor measurements of the MEMS device to identify patterns of heat dispersion from other components and systems of the end-use device. This information may be used to proactively perform compensation such as by modifying the operation of the MEMS device prior to thermal gradients from the heat source actually affecting the output of the MEMS device. Information from the MEMS device may also be provided to the other components and systems of the MEMS device, for example, to better identify patterns of thermal gradient within the end-use device and modify operations of the end-use device as appropriate (e.g., modifying operating voltages, processing loads, entering low power or sleep modes, etc.).

Once temperature sensor outputs and other related values (e.g., combined outputs based on bridge circuits, etc.) have been received, the processing circuitry may respond to the measured temperature information. One exemplary response may be to compensate for temperature gradients based on changing scaling factors for MEMS device outputs. Calibration testing may be performed during manufacturing or in the field, that may determine changes in MEMS device outputs based on different thermal gradients (e.g., location, degree, pattern). This information may be stored (e.g., in a lookup table stored at the MEMS device) such that additive compensation and/or scaling factors may be applied to maintain correct output values (e.g., linear acceleration, angular velocity, etc.) in the presence of thermal gradients. Another exemplary response may be to modify the operation of the MEMS device. Applied signals such as signals that cause movement of MEMS components (e.g., a drive signal of a MEMS gyroscope) or that are transmitted via proof masses and electrodes (e.g., a sense signal of a MEMS accelerometer or pressure sensor) may be modified based on known temperature effects (e.g., increasing or inhibiting movement of components of a suspended spring-mass system) determined, for example, based on a calibration routine. Another exemplary response may be to modify the operation of the MEMS device as a whole, for example, by placing the sensor in a temporary sleep mode, modifying parameters of a power source for the MEMS device, or otherwise changing the overall usage of the MEMS device. Another exemplary response may be to provide notifications and alerts to other components and systems of the end-use device, such that those components or systems are aware that values output by the MEMS device may be partially compromised versus normal output values. The notifications and alerts may provide information about the heat source, which may permit the other components and systems to modify their operation to reduce the severity of the thermal gradients experienced by the MEMS device. In some embodiments, the notification or alert may request that specific steps be taken by other components and systems. In some embodiments, the notification may provide information about the heat source or thermal gradient that can be used by the external system to modify their operation.

Figure 3A:
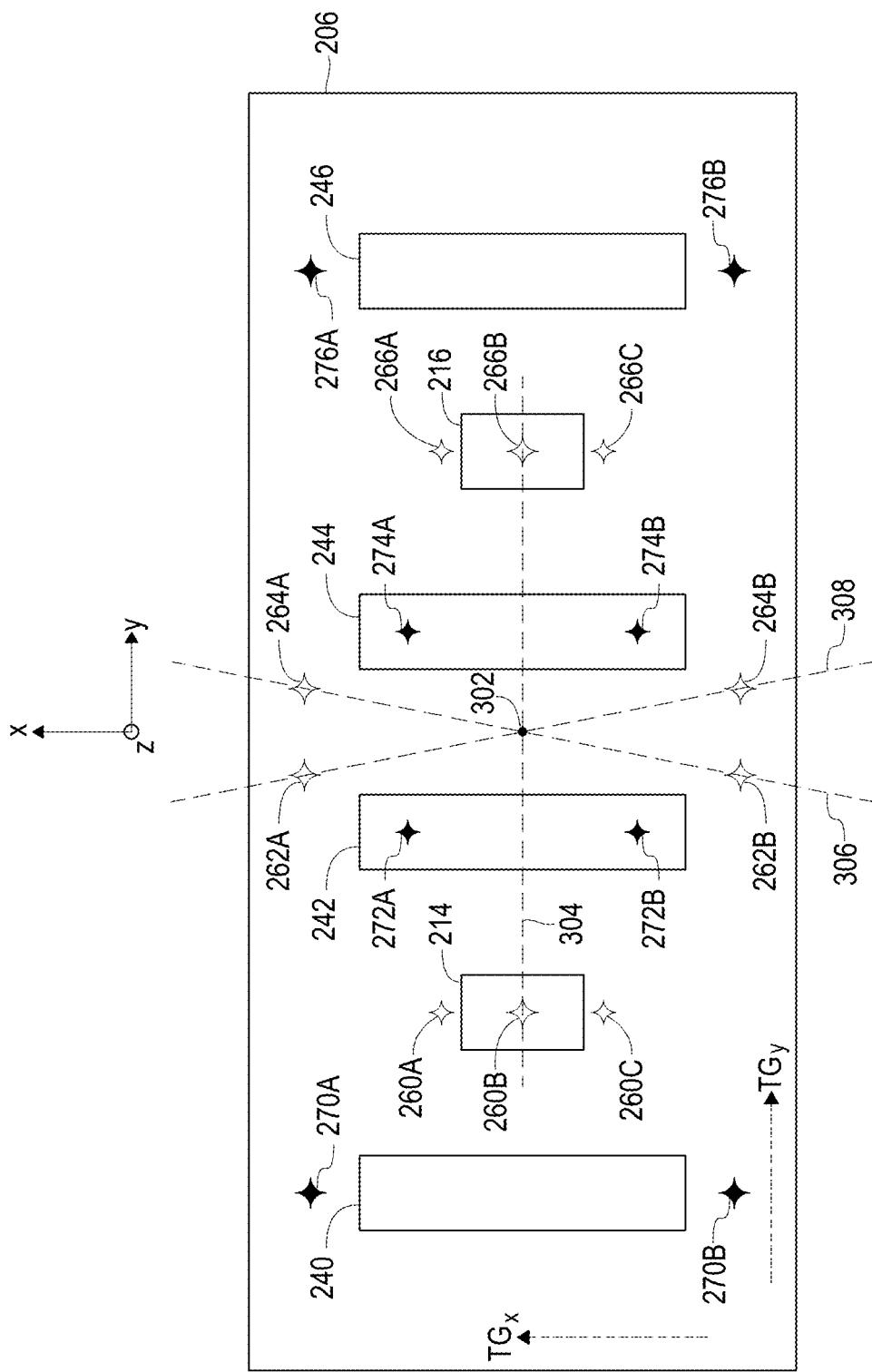
FIG. 3A shows an exemplary temperature sensing configuration in accordance with some embodiments of the present disclosure.
Figure 3B:
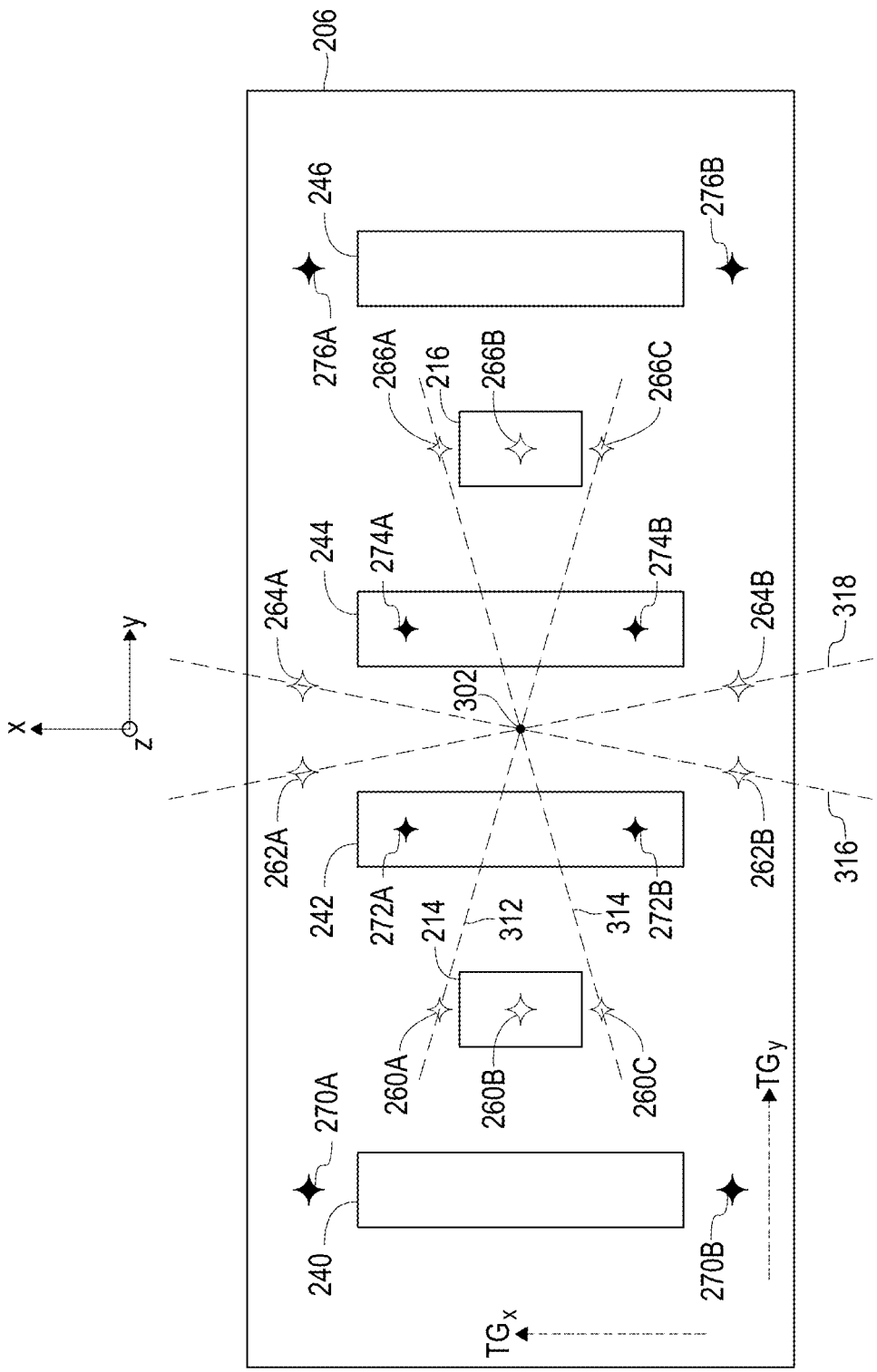
FIG. 3B shows another exemplary temperature sensing configuration in accordance with some embodiments of the present disclosure.
Figure 3C:
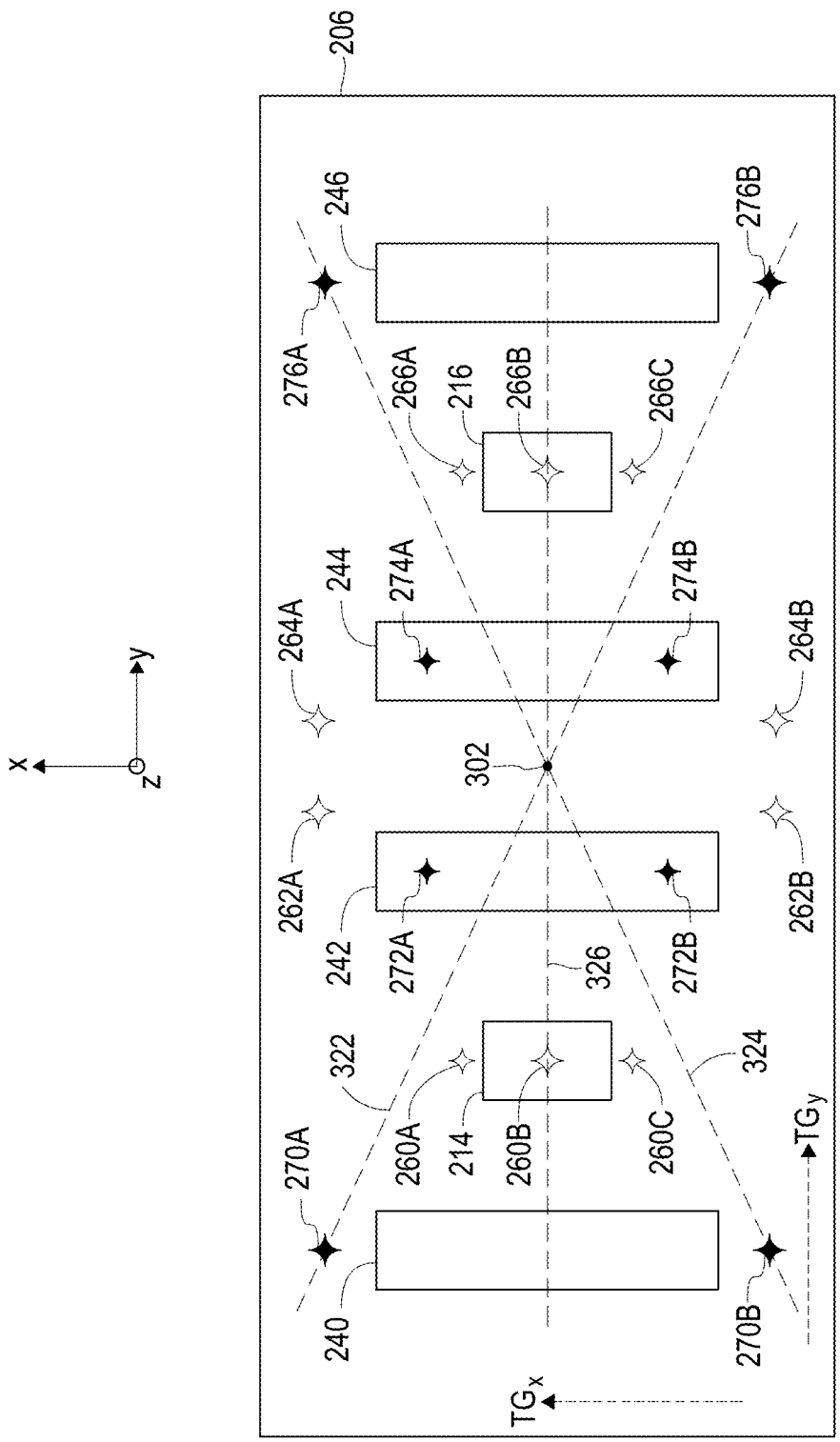
FIG. 3C shows another exemplary temperature sensing configuration in accordance with some embodiments of the present disclosure.

FIGS. 3A-3C show exemplary temperature sensing configurations in accordance with some embodiments of the present disclosure. As described herein, within a particular layer (e.g., substrate layer 206) there may be a limited number of locations at which a substantial heat source may be applied to the layer. In the exemplary embodiment of substrate 206 of FIGS. 2A-2B and 3A-3C, those locations may correspond to the sides of the substrate 206 (e.g., left-side or negative y-side, right-side or positive y-side, top-side or positive x-side, bottom-side or negative x-side), the lower surface of the substrate layer 206 (e.g., lower x-y plane of FIG. 2A, not depicted in FIG. 2B and FIGS. 3A-3C), and the upper cavity-facing surface of substrate layer 206 (e.g., with substantial heat sources corresponding to the anchoring locations 214 and 216, as well as the bonding points to the MEMS layer along the previously-described sides that form the cavity (depicted in FIG. 2A).

In the exemplary embodiments of FIGS. 2A-2B and FIGS. 3A-3C, the structure may be symmetric about a center point with respect to the heat sources. Whether or not such symmetry exists in other MEMS device designs, it may also be possible to identify center point locations where heat sources are balanced with respect to their potential contribution to the overall thermal behavior at the center point. Combinations of temperature sensors may then be identified that allow for the rejection of some thermal gradients in order to isolate contributions from particular thermal gradients of interest. In the exemplary embodiments of FIGS. 3A-3C, temperature sensor locations may be identified to reject thermal gradients in the x-y plane due to heat sources applied at the side of the substrate layer 206, in order to isolate a thermal gradient received at the substrate layer 206 from MEMS layer 204 via anchoring locations 214 and 216. For example, some MEMS devices may be particularly sensitive to z-axis thermal gradients that cause relative movement (i.e., not due to a force to be measured) between portions of the MEMS layer 204 and the substrate layer 206.

FIG. 3A shows an exemplary temperature sensing configuration for rejecting x-y plane thermal gradients from while identifying z-axis thermal gradients received via anchoring locations 214 and 216. In the exemplary embodiment of FIG. 3A, temperature sensors 260B and 266B along measurement axis 304 may be utilized with temperature sensors 264A and 262B along measurement axis 306 and/or temperature sensors 262A and 264B along measurement axis 308. The measurement axes may cross at center point 302. The sensors along measurement axis 304 are located at the anchoring locations 214 and 216 while the temperature sensors along measurement axis 306 and 308 are located at identical respective x-y distances from the anchoring locations 214 and 216, such that heat received from the MEMS layer 204 via anchoring locations 214 and 216 will propagate to these temperature sensors in a similar manner. In this manner, the response of the temperature sensors along measurement axis 304, 306, and 308 to the z-axis thermal gradient should be correlated (e.g., in proportion to the respective distance from the anchors). On the other hand, thermal gradients from other heat sources (e.g., along the sides of the substrate layer 206) will be experienced in a differential manner by the sensors, based on their respective location with respect to the side where the heat source is applied.

The distances between respective sensors along these axes are identical (e.g., the x-axis distance between temperature sensor 260B to temperature sensors 262A and 262B is identical to the x-axis distance between temperature sensor 266B to temperature sensors 264A and 264B, the x-axis distance between temperature sensor 260B to temperature sensors 264A and 264B is identical to the x-axis distance between temperature sensor 266B to temperature sensors 262A and 262B, the y-axis distance between temperature sensor 260B to temperature sensors 262B and 264B is identical to the y-axis distance between temperature sensor 266B to temperature sensors 262A and 264A, and the y-axis distance between temperature sensor 260B to temperature sensors 262A and 264A is identical to the y-axis distance between temperature sensor 266B to temperature sensors 262B and 264B). The outputs of the sensors can be analyzed (e.g., as depicted and described in a bridge configuration of FIG. 4) such that thermal gradients from heat sources along the sides of the substrate layer 206 effectively cancel, while the thermal gradients along the z-axis are additive and are provided as an output.

For example, because temperature sensors 262A, 262B, 264A, and 264C are located away from the anchors 214 and 216, temperatures measured by them are impacted by dispersion of heat from anchors 214 and 216 through substrate layer 206, as well as other lateral thermal gradients within the substrate layer 206 such as x-axis thermal gradient TGx, y-axis thermal gradient TGy, or an in-plane thermal gradient having both x-axis and y-axis components. For example, in addition to heat dispersion along the z-axis from the MEMS layer through the anchors 214 and 216 dispersion of heat in-plane as a lateral thermal gradient, the substrate layer 206 may also experience thermal gradients due to an adjacent heat source that also creates a lateral thermal gradient. As described herein, the primary concern for the many MEMS devices may be z-axis thermal gradients. Accordingly, as described herein, temperature sensors may be located at respective locations within the x-y plane of the substrate layer 206 in order to reject the effect of lateral thermal gradients due to lateral heat sources (and lateral thermal gradients caused by dispersion from anchors 014 and 216) while isolating only the z-axis thermal gradient.

In an embodiment, the temperature sensors are located at specific relative locations in order to reject lateral thermal gradients due to lateral heat sources, and also to counteract any changes in temperature response due to any induced strain effects. The temperature sensors 262A/264B and 264A/262B may be located at equivalent distances respective to associated temperature sensors 260B and 266B. The temperature sensors are further placed about a center point within the substrate layer with respect to the anchoring regions 214 and 216. In particular, a first distance between temperature sensor 262A and center point 302 is the same distance between temperature sensor 264B and center point 302. Similarly, a second distance between temperature sensor 264A and center point 302 is the same distance between temperature sensor 262B and center point 302. A third distance between temperature sensor 260B and center point 302 is the same distance between temperature sensor 266B and center point 302, though this may be different from the first and second distances. The temperature sensors are symmetric to one another about the center point 302. In this manner, when a strain is induced on the temperature sensors, the resulting changes of output values of each of the temperature sensors are similar and balanced, resulting in the rejection of strain effects on the overall output signal.

In response to a thermal gradient in the z axis and absence of a lateral thermal gradient applied by lateral heat sources (and assuming no strain or other effects), temperature sensors 260B and 266B will have a similar response, since each is located at an equivalent location below their respective anchoring regions 214 and 216. Similarly, in the absence of a lateral thermal gradient applied by lateral heat sources (and assuming no strain or other effects), the only source of heat dispersion to temperature sensors 262A/264A/262B/264B is the in-plane temperature distribution within the substrate layer 206 due to heat dispersion from anchoring regions 214 and 216 in response to the z-axis thermal gradient. Because the temperature sensors 262A/264A/262B/264B are equidistant from the anchoring regions 214 and 216, they will have a similar response due to the in-plane temperature distribution from the anchoring regions. In this manner, the output at the temperatures sensors 260B, 266B, and 262A/264A/262B/264B due to the z-axis thermal gradient may be additive based on the relative placement of the temperature sensors (e.g., two under the anchoring regions, two or four remote from the anchoring regions, with the temperature sensors balanced and equidistant about a center point between the anchoring regions and aligned along axes about center point).

In the presence of a lateral thermal gradient within the substrate layer 206 due to a lateral heat source, the lateral thermal gradient may disperse through the substrate layer 206 within the plane of the temperature sensors in the x-direction and/or y-direction based on the location of the heat source. For example, the presence of a heat source along the right-hand side (i.e., in the positive y direction) and a cold source along the left-hand side (i.e., in the negative y direction) of the substrate 206 may disperse heat from left to right as depicted by thermal gradient TGx in FIG. 3, with the temperature change sensed by the temperature sensors 262A/264B and 262A/264A being equal and opposite in magnitude, with relatively larger temperature changes at each of temperature sensors 260B and 266B due to the thermal gradient TGx. The presence of a heat source along the top side (i.e., in the positive x direction) and a cold source along the bottom side (i.e., in the negative x direction) of the substrate layer 206 may disperse heat from bottom-to-top as depicted by thermal gradient TGx in FIG. 4, with the temperature change sensed by the temperature sensors 262A/264B and 262A/264A being equal and opposite in magnitude, with relatively smaller temperature changes at each of temperature sensors 260B and 266B due to the thermal gradient TGx.

Lateral thermal gradients may also be applied in both the x direction and y direction at the same time, for example, from multiple heat sources located adjacent to the substrate layer 206 of the MEMS accelerometer or a point heat source that distributes in multiple directions. However, in all instances the lateral thermal gradients from adjacent heat sources (e.g., with the exception of lateral thermal gradients from dispersion of heat from the anchoring region) may be applied at a side of the substrate layer 206 and then disperse throughout the substrate layer in a manner that results in differential temperature changes between the temperature sensors. In contrast, as a result of the relative locations of the temperature sensors 260B, 266B, and 262A/262B/264A/264B, a z-axis thermal gradient applied to the anchoring region will result in equivalent increases in temperature at temperature sensors 260B and 266B and at temperature sensors 262A/262B/264A/264B, respectively. Accordingly, the relative temperature sensed by these temperature sensors may be used to distinguish changes in temperature due to z-axis thermal gradient (i.e., evidenced by equivalent temperature changes at the thermistors) and changes in temperature due to lateral thermal gradients (i.e., evidenced by differing changes in temperature at the temperature sensors based on the location of the lateral heat source)

FIGS. 3B and 3C show additional exemplary configurations of temperature sensors for rejecting x-y plane thermal gradients while accentuating z-axis thermal gradients received via the anchoring locations. Consistent with the description of FIG. 3A, temperature sensors are selected based on configurations that provide additive responses to the z-axis thermal gradient received via anchoring regions 214 and 216 and proportional and differential responses to other thermal gradients. In the exemplary embodiment of FIG. 3B, some of the respective measurement axes may be orthogonal to each other, such as measurement axes 312 and 316 and measurement axes 314 and 318. In the exemplary embodiment of FIG. 3C, some of the temperature sensors (e.g., temperature sensors 276A and 270B along measurement axis 324 and temperature sensors 270A and 276B along measurement axis 322) may be located on an x-y plane beneath the temperature sensors that are proximate to the anchoring locations 214 and 216.

Figure 4:
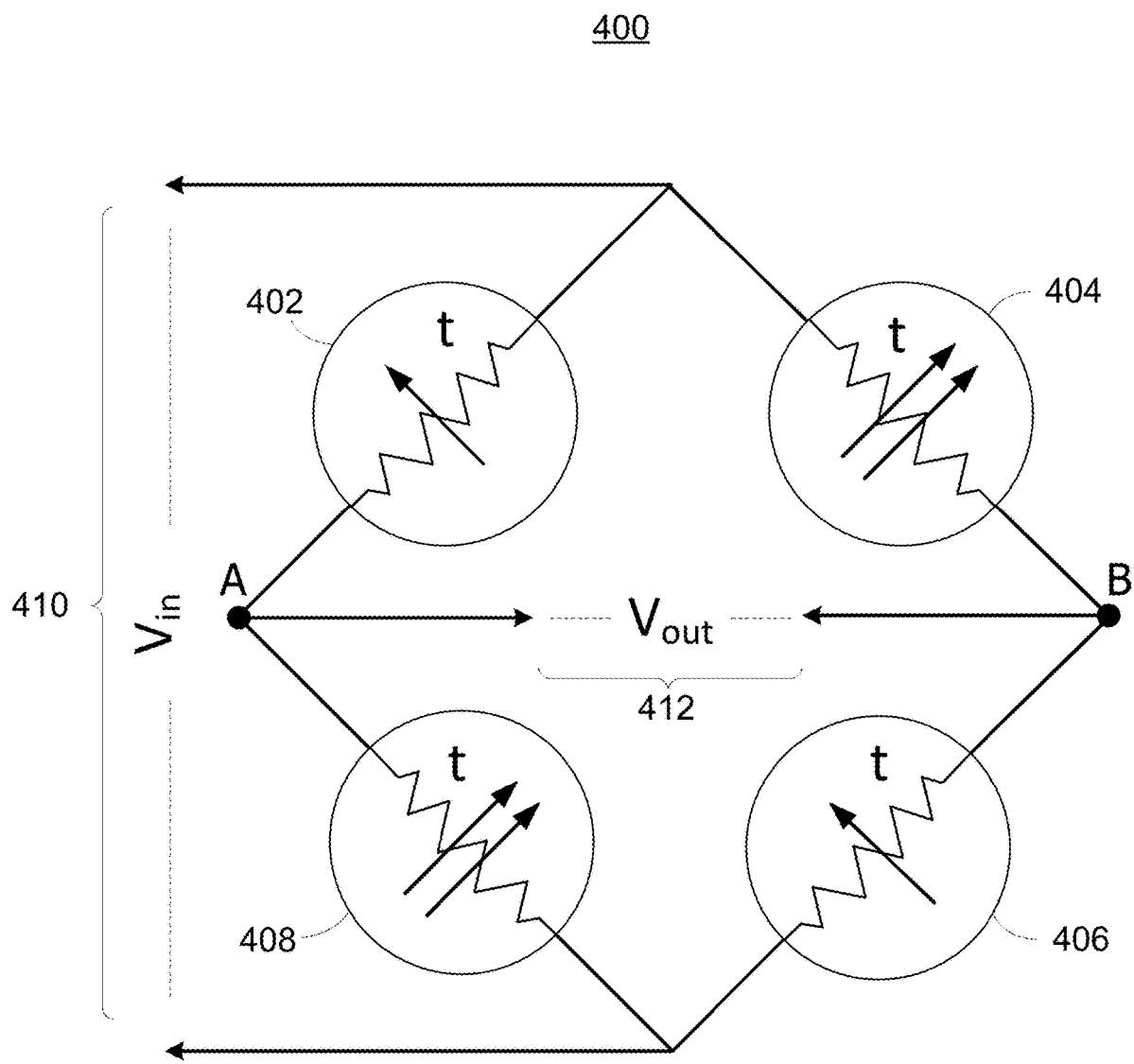
FIG. 4 shows exemplary Wheatstone bridge processing circuitry in accordance with some embodiments of the present disclosure.

In an exemplary embodiment, temperature outputs from the thermistors may be processed using a bridge configuration, such as a Wheatstone bridge configuration, as will be discussed further in the description for FIG. 4. FIG. 4 shows exemplary Wheatstone bridge processing circuitry in accordance with some embodiments of the present disclosure. The exemplary configuration of FIG. 4, when used with temperature sensors (e.g., thermistors) located as described herein and depicted in FIGS. 3A-3C, may enable the accurate measurement of a vertical thermal gradient (e.g., a Vout value 412) while rejecting effects of strain and lateral thermal gradients from adjacent heat sources. Although thermistors are depicted in FIG. 4, it will be understood that other types of temperature sensors (e.g., BJTs or MOSFETs) or combinations thereof may be utilized in the Wheatstone bridge arrangement described herein.

FIG. 4 shows illustrative temperature measurement configuration 400 in accordance with some embodiments of the present disclosure. Temperature measurement configuration 400 arranges thermistors 402, 404, 406, and 408 in a Wheatstone bridge configuration. Because the resistance of thermistors is temperature-dependent, measuring the resistances at the thermistors provides an estimate of the corresponding temperatures. Voltage 410, a known voltage Vin, is applied to the Wheatstone bridge and voltage 412, a measured voltage Vout, is used to determine an output that changes in proportion to the z-axis thermal gradient applied at the anchoring regions.

Consider four resistances $R_{402}$, $R_{404}$, $R_{406}$, and $R_{408}$ corresponding to four thermistors 402, 404, 406, and 408 at temperatures $t_{402}$, $t_{404}$, $t_{406}$, and $t_{408}$, respectively. Resistances $R_{402}$, $R_{404}$, $R_{406}$, and $R_{408}$ are proportional to temperatures $t_{402}$, $t_{404}$, $t_{406}$, and $t_{408}$ according to the design of the thermistors. Accordingly, variations in temperature result in changes to resistance, which in turn, changes the output voltage. Thus, the output voltage 412 (Vout) is equal the difference between voltage at the node A between thermistor 402 and thermistor 408 (i.e., input voltage $Vin*R_{402}/(R_{402}+R_{408})$) and the voltage at the node B between thermistor 404 and thermistor 406 (i.e., input voltage $Vin*R_{404}/(R_{406}+R_{404})$).

In an embodiment of the present disclosure, thermistor 402 may correspond to a first thermistor remote from the anchors, thermistor 406 may correspond to a thermistor located along a common measurement axis on the opposite side of the center point 302 from thermistor 402, thermistor 404 may correspond to a thermistor located proximate one of the anchoring locations, and thermistor 408 may correspond to a thermistor proximate the other anchor and located along a common measurement axis on the opposite side of the center point 302 from thermistor 406. In response to no temperature gradient, all of the thermistors (e.g., assuming that the thermistors have identical values and temperature responses) should be at the same temperature and thus will have identical resistances. The voltage at node A will be one half of the input voltage Vin, as will the voltage at node B. Thus, the output voltage Vout will be zero. When a z-axis thermal gradient is applied to the anchoring regions, the thermistors located below the anchoring regions (e.g., thermistors 404 and 408) may experience a substantial change (e.g., decrease) in resistance due to exposure to the thermal gradient, while the change (e.g., reduction) in resistance of the thermistors located away from the anchoring regions (i.e., thermistors 402 and 406) may be significantly less substantial. Thus, the voltage at node A will increase due to the $R_{402}$ having a relatively large value as compared to $R_{408}$ while the voltage at node B will decrease due to the $R_{406}$ having a relatively large value as compared to $R_{404}$. Because thermistors 404 and 408 change resistance in the same manner, and thermistors 402 and 406 change resistance in the same manner, the increase in the voltage at node A and the decrease in the voltage at node B are proportional. In this manner, Vout increases as the vertical thermal gradient increases and reduces to zero as the vertical thermal gradient decreases.

The thermistor configurations of FIGS. 3A-3C and their processing in the Wheatstone bridge of FIG. 4 may also reject lateral thermal gradients due to adjacent heat sources. For example, if a heat source is applied at the left side of the substrate layer 206 and a cold source on the opposite side, resulting in a thermal gradient in the direction indicated by TGx, the temperature at each of the thermistors 402-408 will increase, but in different proportions. For example, the temperature of thermistor 404 will feature the greatest change in resistance (e.g., a decrease resulting from the greatest relative increase in temperature), the temperature of thermistor 406 will feature the second greatest change in resistance (e.g., a decrease resulting from the second greatest relative increase in temperature), the temperature of thermistor 402 will feature the third greatest change in resistance (e.g., a decrease resulting from the third greatest relative increase in temperature), and the temperature of thermistor 408 will feature the least change in resistance (e.g., a decrease resulting from the least relative increase in temperature). Because the x-axis distance between thermistor 404 and thermistor 406 is the same as the x-axis distance between thermistor 402 and thermistor 408, the relative change in resistance of thermistor 404 compared to thermistor 406 is the same as the relative change in resistance of thermistor 402 compared to thermistor 408 (i.e., with thermistor 404 and 402 experiencing proportionally larger changes in resistance compared to thermistor 402 and 408). Thus, while the voltages at nodes A and B change as a result of the lateral thermal gradient, they change in the same manner such that Vout remains zero. The thermistor configuration of FIG. 4 similarly rejects lateral thermal gradients along the x-axis (e.g., applied to the top or bottom side of the substrate layer 206).

Figure 5:
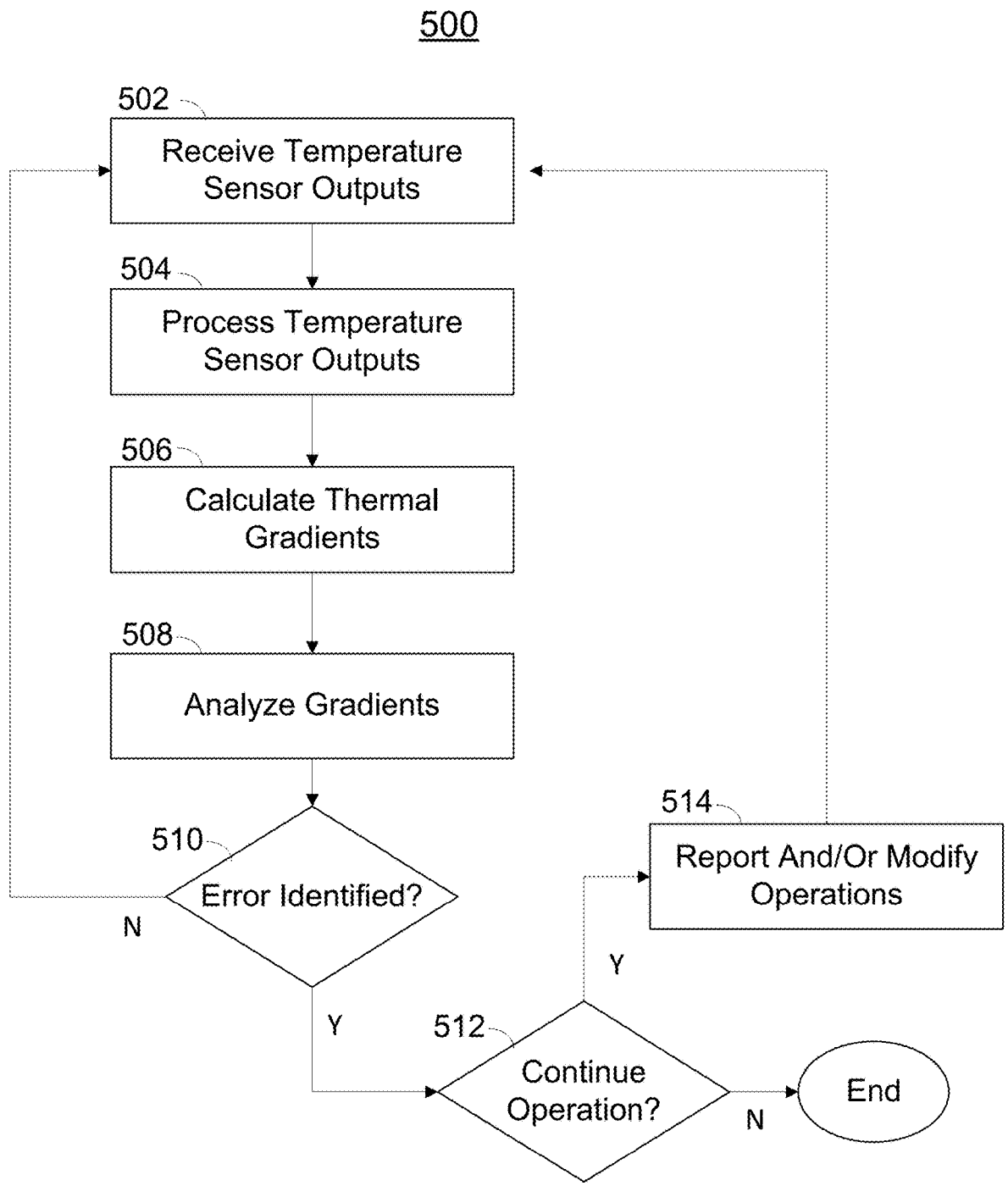
FIG. 5 shows exemplary steps for processing received temperature sensor outputs in accordance with some embodiments of the present disclosure.

FIG. 5 shows exemplary steps for processing received temperature sensor outputs in accordance with some embodiments of the present disclosure. Although FIG. 5 is described in the context of the present disclosure, it will be understood that the methods and steps described in FIG. 5 may be applied to a variety of MEMS device designs, temperatures sensor types, processing circuitry, and compensation techniques. Although a particular order and flow of steps is depicted in FIG. 5, it will be understood that in some embodiments one or more of the steps may be modified, moved, removed, or added, and that the flow depicted in FIG. 5 may be modified.

At step 502, temperature sensor outputs may be received (e.g., by processing circuitry of the MEMS device) from temperature sensors located on and/or within one or more layers of the MEMS device. The temperature sensor outputs may be received over time, such that patterns and changes in temperature may be identified. In some embodiments, the temperature sensor outputs may be taken at particular stages in sensor operation, such as at power up, initiation of measurements, periodically during MEMS device operation, and prior to shut down. In some embodiments (not depicted in FIG. 5), information from other devices, components and sensors may also be acquired (e.g., relating to operation of adjacent components, external temperature measurements, power consumption, etc.). Once the temperature sensor outputs are received, processing may continue to step 504.

At step 504, the temperature sensor outputs may be processed. Temperature sensor outputs may be processed individually, for example, with filters to remove noise from temperature sensor outputs and amplifiers, A/D converters, and other suitable components to provide appropriate scaling for further analysis. In some embodiments, multiple temperature sensor outputs may be processed together, for example, by bridges such as Wheatstone bridges as described herein. Once the temperature sensor outputs are processed for further analysis, processing may continue to step 506.

At step 506, thermal gradients may be calculated based on the received values. As described herein, by having multiple temperature sensors at particular locations with respect to heat sources and, in some embodiments, at different layers or depths within layers, absolute temperatures at particular locations temperature differences between different locations may be identified. Rates of change of thermal gradients may also be determined based on thermal gradient information over time. Once the thermal gradients have been calculated, processing may continue to step 508.

At step 508, the thermal gradients may analyzed to determine whether some form of action should be taken. In some embodiments, tolerances may be associated with absolute temperature at particular locations, number of temperature sensors identifying an absolute temperature above threshold values, temperature differences between particular temperature sensor locations, number of temperature differences exceeding threshold values, and rate of change of absolute temperatures values and/or temperature difference values. In some embodiments, a heat source may be identified based on the thermal gradient information, for example, by identifying a location of the heat source and a pattern of application. This heat source identification may be compared to known heat source locations and patterns, as well as data received from other sources (e.g., external temperature sensor data or information about operation of other components or devices). Once the thermal gradients are analyzed, processing may continue to step 510.

At step 510, it may be determined (e.g., by processing circuitry) whether an error that requires additional action has been identified. If no additional action is required, processing may return to step 502 to receive additional temperature sensor outputs. If additional action is required, the additional action may be identified based on the type and severity of error that is identified. Processing may then continue to step 512.

At step 512, it may be determined whether the MEMS device may continue operation in spite of the error. In some embodiments, thermal gradients that indicate errors but with characteristics (e.g., absolute temperature, temperature difference, rate of change) that fall below certain thresholds and thus may require only notifications or modifications to operation of the MEMS device, while more severe errors may require partial or complete shutdown of the MEMS device. If the MEMS device may continue operation, processing may continue to step 514. If the MEMS device may not continue operation, processing may end.

At step 514, notifications may be provided and/or the operations of the MEMS device may be modified to continue operation despite the identified error. Notifications may be internal to the MEMS device and/or may be provide to external components and devices, and may provide information about the nature and severity of the error, and any corrective action taken by the MEMS device or to be taken by other components and devices (e.g., modifying an accuracy of the output of the MEMS device). In some embodiments, the notification may include requests or instructions to reduce or mitigate heat dispersion from the heat source, for example, by modifying operation of an external component or device. Modifications to the operation of the MEMS device may include a variety of modifications as described herein, such as modification of scaling factors, changes to calculation of measured parameters, and modification of operating parameters of the MEMS device (e.g., drive voltages, sense voltages, etc.). Once notifications have been provided and/or operations of the sensor have been modified, processing may return to step 502 to receive additional temperature sensor outputs.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) device, comprising:
   a layer;
   a plurality of temperature sensors located within the layer, comprising;
      a first temperature sensor at a first location relative to a center point within the layer, wherein a first response of the first temperature sensor changes based on a temperature at the first location;
      a second temperature sensor at a second location relative to the center point, wherein the second location is on a first common measurement axis on an opposite side of the center point from the first location, and wherein a second response of the second temperature sensor changes based on a temperature at the second location;
      a third temperature sensor at a third location relative to the center point, wherein a third response of the third temperature sensor changes based on a temperature at the third location, and wherein a first output value is based on the first response and the third response; and
      a fourth temperature sensor at a fourth location relative to the center point, wherein the fourth location is on a second common measurement axis on an opposite side of the center point from the third location, wherein a fourth response of the fourth temperature sensor changes based on a temperature at the fourth location, and wherein a second output value is based on the second response and the fourth response; and
   processing circuitry configured to output a signal that corresponds to a vertical thermal gradient perpendicular to the layer based on a change in a difference between the first output value and the second output value in response to the vertical thermal gradient, and wherein the processing circuitry rejects a lateral thermal gradient within the layer in outputting the signal.

2. The MEMS device of claim 1, wherein the layer comprises a first layer, further comprising at least one anchor and a second layer, wherein the at least one anchor couples the first layer to the second layer.

3. The MEMS device of claim 2, wherein the at least one anchor is located vertically above the center point.

4. The MEMS device of claim 2, wherein the at least one anchor comprises a plurality of anchors each located equidistant from the center point.

5. The MEMS device of claim 2, further comprising a gap between the first layer and the second layer, wherein the at least one anchor is located within the gap.

6. The MEMS device of claim 2, wherein a first anchor of the at least one anchor is in contact with the first layer at a first anchoring location, wherein the third temperature sensor of the plurality of temperature sensors is located below the first anchoring location, wherein a second anchor of the at least one anchor is in contact with the first layer at a second anchoring location, wherein the fourth temperature sensor of the plurality of temperature sensors is located below the second anchoring location, and wherein the first and the second temperature sensors of the plurality of temperature sensors are not located below the first or the second anchoring locations.

7. The MEMS device of claim 1, wherein the layer comprises a first layer, further comprising a second layer, wherein the first layer comprises a first plane located within the first layer, wherein the second layer comprises a second plane located within the second layer, and wherein each of the plurality of temperature sensors is located within the first plane.

8. The MEMS device of claim 7, wherein the first plane is parallel to the second plane.

9. The MEMS device of claim 1, wherein the layer comprises a first layer, further comprising a second layer, wherein the second layer comprises a MEMS layer and the first layer comprises a CMOS layer.

10. The MEMS device of claim 1, wherein the first common measurement axis and the second common measurement axis are orthogonal axes.

11. The MEMS device of claim 1, wherein a respective output from one or more of the plurality of temperature sensors changes based on a strain induced on the one or more of the plurality of temperature sensors, and wherein, in response to the strain induced on the one or more of the plurality of temperature sensors, the signal is substantially unchanged.

12. The MEMS device of claim 11, wherein the one or more of the plurality of temperature sensors comprise at least two temperature sensors, and wherein, in response to the strain induced on the one or more of the plurality of temperature sensors, the signal is substantially unchanged based on the two temperature sensors being equidistant from a center point within the layer.

13. The MEMS device of claim 1, wherein a respective output from one or more of the plurality of temperature sensors changes based on a strain induced on the one or more of the plurality of temperature sensors, and wherein the signal changes in response to the strain induced on the one or more of the plurality of temperature sensors.

14. The MEMS device of claim 1, wherein the plurality of temperature sensors comprises BJTs, MOSFETs, or thermistors.

15. The MEMS device of claim 1, wherein the plurality of temperature sensors is configured in a Wheatstone bridge, and wherein the processing circuitry is coupled to the plurality of temperature sensors via the Wheatstone bridge.

16. The MEMS device of claim 1, further comprising one or more switching elements to select a subset of the plurality of temperature sensors to reconfigure the signal to change in response to one of a thermal gradient perpendicular to the layer, a thermal gradient parallel to the layer, an induced strain, or a temperature value.

17. The MEMS device of claim 1, wherein the MEMS device comprises an accelerometer, a gyroscope, a magnetometer, a barometer, a microphone, or an ultrasonic sensor.

18. The MEMS device of claim 1, wherein the processing circuitry rejects any lateral thermal gradient within the layer based on a proportional response of the first output value and the second output value to the lateral thermal gradient.

19. The MEMS device of claim 1, wherein the respective responses of the plurality of temperature sensors correspond to changes in current, voltage, or resistance.

20. A substrate of a microelectromechanical (MEMS) device, comprising:
a plurality of temperature sensors located within the substrate, comprising;
a first temperature sensor at a first location relative to a center point within the substrate, wherein a first response of the first temperature sensor changes based on a temperature at the first location;
a second temperature sensor at a second location relative to the center point, wherein the second location is on a first common measurement axis on an opposite side of the center point from the first location, and wherein a second response of the second temperature sensor changes based on a temperature at the second location;
a third temperature sensor at a third location relative to the center point, wherein a third response of the third temperature sensor changes based on a temperature at the third location, and wherein a first output value is based on the first response and the third response; and
a fourth temperature sensor at a fourth location relative to the center point, wherein the fourth location is on a second common measurement axis on an opposite side of the center point from the third location, wherein a fourth response of the fourth temperature sensor changes based on a temperature at the fourth location, and wherein a second output value is based on the second response and the fourth response; and
processing circuitry configured to output a signal that corresponds to a vertical thermal gradient perpendicular to the substrate based on a change in a difference between the first output value and the second output value in response to the vertical thermal gradient, and wherein the processing circuitry rejects a lateral thermal gradient within the substrate in outputting the signal.

21. A method for operating a microelectromechanical (MEMS) device, comprising:
generating, by a first temperature sensor, a first temperature signal at a first location relative to a center point within a substrate layer of the MEMS device, wherein the first temperature signal of the first temperature sensor changes based on a temperature at the first location;
generating, by a second temperature sensor, a second temperature signal at a second location relative to the center point, wherein the second location is on a first common measurement axis on an opposite side of the center point from the first location, and wherein the second temperature signal of the second temperature sensor changes based on a temperature at the second location;
generating, by a third temperature sensor, a third temperature signal at a third location relative to the center point, wherein the third temperature signal of the third temperature sensor changes based on a temperature at the third location;
generating, by a fourth temperature sensor, a fourth temperature signal at a fourth location relative to the center point, wherein the fourth location is on a second common measurement axis on an opposite side of the center point from the third location, and wherein the fourth temperature signal of the fourth temperature sensor changes based on a temperature at the fourth location;
generating, by processing circuitry, a first output value based on the first temperature signal and the third temperature signal;

generating, by the processing circuitry, a second output value based on the second temperature signal and the fourth temperature signal; and outputting, by the processing circuitry, a signal that corresponds to a vertical thermal gradient perpendicular to the substrate layer based on a change in a difference between the first output value and the second output value in response to the vertical thermal gradient, wherein the processing circuitry rejects a lateral thermal gradient within the substrate layer in outputting the signal.

\* \* \* \* \*